(12) United States Patent
Lee et al.

(10) Patent No.: US 8,871,557 B2
(45) Date of Patent: Oct. 28, 2014

(54) PHOTOMULTIPLIER AND MANUFACTURING METHOD THEREOF

(75) Inventors: Joon Sung Lee, Daejeon (KR); Yong Sun Yoon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 265 days.

(21) Appl. No.: 13/601,948

(22) Filed: Aug. 31, 2012

(65) Prior Publication Data

US 2013/0056843 A1    Mar. 7, 2013

(30) Foreign Application Priority Data

Sep. 2, 2011   (KR) .......................... 10-2011-0089023
Mar. 15, 2012  (KR) .......................... 10-2012-0026726

(51) Int. Cl.
*H01L 21/00*   (2006.01)
*H01L 31/107*  (2006.01)

(52) U.S. Cl.
CPC ................................ *H01L 31/107* (2013.01)
USPC .................................... 438/87; 257/E31.119

(58) Field of Classification Search
CPC ......... H01L 31/00; H01L 31/08; H01L 31/10; H01L 31/107
USPC .............................. 438/87; 257/438, E31.119
See application file for complete search history.

(56) References Cited

U.S. PATENT DOCUMENTS

| | | | | |
|---|---|---|---|---|
| 3,775,192 A | * | 11/1973 | Beale | 438/370 |
| 4,651,187 A | * | 3/1987 | Sugimoto et al. | 257/186 |
| 5,030,579 A | * | 7/1991 | Calviello | 438/67 |
| 5,364,800 A | * | 11/1994 | Joyner | 438/405 |
| 5,548,149 A | * | 8/1996 | Joyner | 257/347 |
| 5,681,778 A | * | 10/1997 | Manning | 438/297 |
| 5,907,181 A | * | 5/1999 | Han et al. | 257/630 |
| 5,930,642 A | * | 7/1999 | Moore et al. | 438/407 |
| 5,998,854 A | * | 12/1999 | Morishita et al. | 257/565 |
| 6,022,768 A | * | 2/2000 | Peidous | 438/197 |
| 7,759,623 B2 | | 7/2010 | Teshima et al. | |
| 2002/0048837 A1 | * | 4/2002 | Burke et al. | 438/48 |
| 2002/0063303 A1 | * | 5/2002 | Pauchard et al. | 257/461 |
| 2011/0121423 A1 | * | 5/2011 | Forsyth et al. | 257/438 |

FOREIGN PATENT DOCUMENTS

KR   10-2007-0033535 A   3/2007
RU          2102820 C1    1/1998

* cited by examiner

*Primary Examiner* — Shaun Campbell

(57) ABSTRACT

Provided are a photomultiplier and a manufacturing method thereof. The manufacturing method thereof may include forming a mask layer on an active region of a substrate doped with a first conductive type, ion implanting a second conductive type impurity opposite to the first conductive type into the substrate to form a first doped region in the active region under the mask layer and an non-active region exposed from the mask layer, forming a device isolation layer on the non-active region, removing the mask layer, and ion implanting the second conductive type impurity having a concentration higher than that of the first doped region into an upper portion of the first doped region in the active region to form a second doped region shallower than the first doped region.

8 Claims, 7 Drawing Sheets

PHOTOMULTIPLIER AND MANUFACTURING METHOD THEREOF

CROSS-REFERENCE TO RELATED APPLICATIONS

This U.S. non-provisional patent application claims priority under 35 U.S.C. §119 of Korean Patent Applications Nos. 10-2011-0089023, filed on Sep. 2, 2011, and 10-2012-0026726, filed on Mar. 15, 2012, the entire contents of which are hereby incorporated by reference.

BACKGROUND

The present invention disclosed herein relates to a semiconductor device and a manufacturing method thereof, and more particularly, to a photomultiplier and a manufacturing method thereof.

A semiconductor optical sensor may include an avalanche photodiode detecting weak light. The avalanche photodiode may highly sensitively detect light by avalanche multiplication accelerating electron-hole pairs. Research and development into a semiconductor photomultiplier, which is operated in a voltage range exceeding a breakdown voltage and is fabricated to be able to detect very weak incident light, have been actively conducted based on such avalanche photodiode.

A photomultiplier may include cell diodes and quench resistors serially connected to the cell diodes. The quench resistors cause an ohmic voltage drop when an instantaneous current due to electrical breakdown flows in the microcell to drop a voltage applied to each cell diode below a breakdown voltage, and thus, may act to relieve a breakdown state.

In general, a cell diode formed of silicon may include a low concentration epitaxial silicon thin film on a bulk silicon layer in a high concentration doped layer. For example, microcell diodes may have doped structures such as $p^+/p^-/n^+$, $p^+/n^-/n^+$, $n^+/n^-/p^+$, and $n^+/p^-/p^+$.

Such microcell diodes having a simple structure may not be properly operated due to premature edge breakdown. A general photomultiplier may include a guard ring formed at an edge of the microcell diodes in order to prevent the premature edge breakdown.

However, since a typical method of manufacturing a photomultiplier requires a lithography process for forming a guard ring, productivity may decrease. For example, a silicon microcell diode may be formed through approximately three lithography processes including a mask alignment pattern, an upper doped layer pattern, and a guard pattern.

SUMMARY

The present invention provides a photomultiplier able to maximize productivity by simplifying a fabrication process of a silicon microcell diode and a manufacturing method thereof.

Embodiments of the present invention provide methods of manufacturing a photomultiplier including: forming a mask layer on an active region of a substrate doped with a first conductive type; ion implanting a second conductive type impurity opposite to the first conductive type into the substrate to form a first doped region in the active region under the mask layer and an non-active region exposed from the mask layer; forming a device isolation layer on the non-active region; removing the mask layer; and ion implanting the second conductive type impurity having a concentration higher than that of the first doped region into an upper portion of the first doped region in the active region to form a second doped region shallower than the first doped region.

In some embodiments, the first doped region may be formed by a counter ion implantation process. The counter ion implantation process may include a multiple ion implantation method.

In other embodiments, the second doped region may be formed by a self-aligned ion implantation process or self-aligned diffusion process of the device isolation layer.

In still other embodiments, the device isolation layer may include a silicon oxide layer formed by a local oxidation of silicon (LOCOS) method.

In even other embodiments, the mask layer may include a silicon nitride layer. The silicon nitride layer may be removed by a phosphoric acid, a hydrofluoric acid, or a bromic acid.

In yet other embodiments, the method may further include: forming a first interlayer dielectric on the second doped region and the device isolation layer; forming a quench resistor on the first interlayer dielectric in the non-active region; forming a second interlayer dielectric on the first interlayer dielectric and the quench resistor; removing a portion of the second interlayer dielectric on the quench resistor and each portion of the first and second interlayer dielectrics on the second doped region to form contact holes; forming a first interconnection line on the second interlayer dielectric in the non-active region and a second interconnection line connecting the second doped region and the quench resistors through the contact holes; and forming a bottom electrode on a bottom of the substrate.

In other embodiments of the present invention, photomultipliers may include: a substrate defined by an active region and a non-active region; a cell diode including a first doped region and a second doped region disposed on a lower portion of the substrate in the active region and an upper portion of the active region, respectively; a device isolation layer disposed on the non-active region; a first interlayer dielectric disposed on the device isolation layer and the second doped region; and a quench resistor disposed on the first interlayer dielectric in the non-active region, wherein the first doped region may extend to the non-active region.

In some embodiments, the first doped region may be disposed deeper in the non-active region than the active region.

In other embodiments, the second doped region may be disposed from a top surface of the substrate in the active region to an upper portion of the substrate shallower than the first doped region.

In still other embodiments, the device isolation layer and the first interlayer dielectric may include a silicon oxide layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Figure 1:
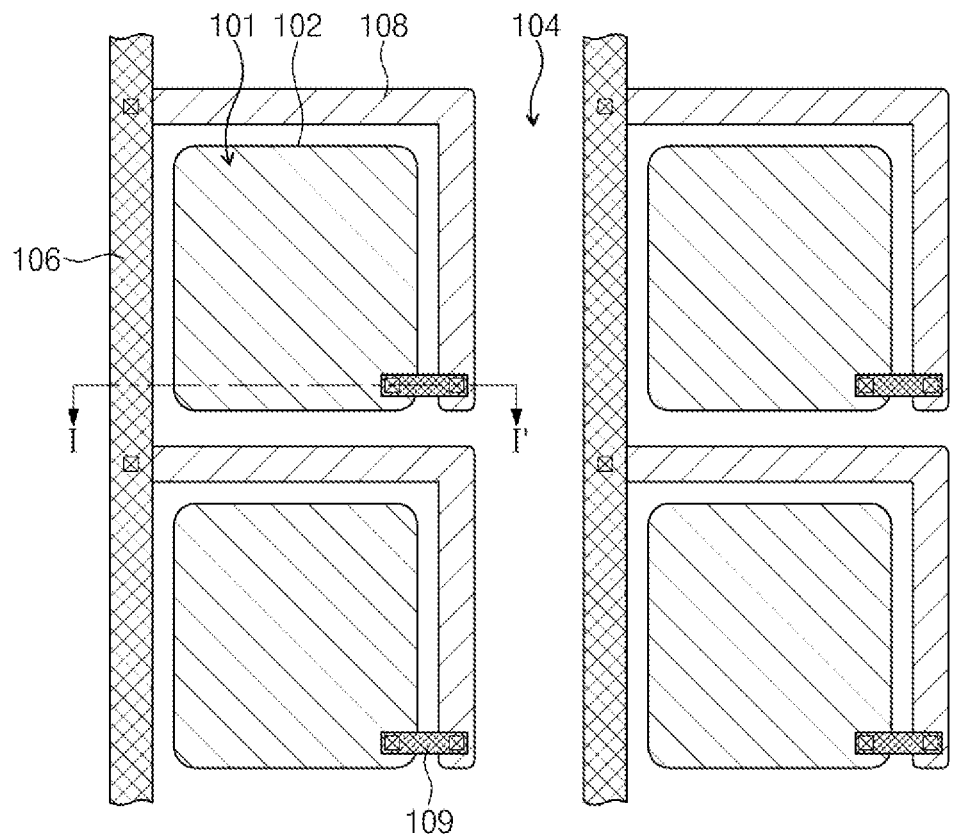
FIG. 1 is a plan view illustrating a photomultiplier according to an embodiment of the present invention.

Hereinafter, preferred embodiments of the present invention will be described in detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. In the drawings, like reference numerals refer to like elements throughout.

In the following description, the technical terms are used only for explaining a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto.

Figure 2:
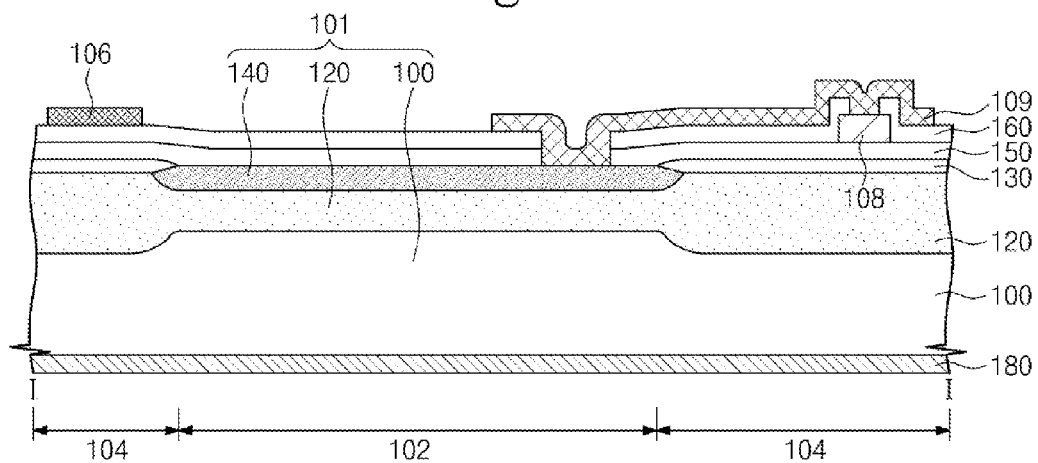
FIG. 2 is a cross-sectional view taken along line I-I' of FIG. 1.

FIG. 1 is a plan view illustrating a photomultiplier according to an embodiment of the present invention. FIG. 2 is a cross-sectional view taken along line I-I' of FIG. 1.

Referring to FIGS. 1 and 2, a photomultiplier of the present invention may include cell diodes 101 serially connected between first interconnection lines 106 and a bottom electrode 180 and quench resistors 108. The first interconnection lines 106 may extend in a parallel direction to one another on a non-active region 104 of a substrate 100. The bottom electrode 180 may be disposed on a bottom of the substrate 100. The cell diodes 101 may have a planar diode structure, in which electrical breakdown occurs due to carriers generated from internal photoexcitation.

For example, the cell diodes 101 may include a lower portion of the substrate 100 in an active region 102, a first doped region 120, and a second doped region 140. The lower portion of the substrate 100 in the active region 102 may be doped with a high concentration first conductive type impurity. The first doped region 120 may be doped with a low concentration first conductive type impurity or second conductive type impurity. The first doped region 120 may extend from the active region 102 to the non-active region 104. That is, the first doped region 120 may be disposed on an upper portion of the entire substrate 100. The first doped region 120 may be disposed deeper in the non-active region than the active region 102. The first doped region 120 in the non-active region 104 may prevent premature edge breakdown of the cell diodes 101.

The second doping region 140 may be doped with a high concentration second conductive type impurity. The first conductive type impurity and second conductive type impurity may have conductive types opposite to each other. The second doped region 140 may be disposed from a top surface of the substrate 100 in the active region 102 to an upper portion of the substrate 100 shallower than the first doped region 120. The second doped region 140 may be doped with the second conductive type impurity having a concentration higher than that of the first doped region 120. The substrate 100 may include a silicon substrate. Also, the first conductive type impurity may include p-type boron or gallium. The second conductive type impurity may include n-type arsenic or phosphor.

The quench resistors 108 may be disposed on a device isolation layer 130 and a first interlayer dielectric 150. The quench resistors 108 may buffer a rapid voltage drop due to a breakdown voltage generated in the cell diodes 101. The quench resistors 108 may include polysilicon doped with a conductive type impurity. First and second interlayer dielectrics 150 and 160 may cover the second doped region 140 of the active region 102 and the device isolation layer 130. The second interlayer dielectric 160 may cover quench resistors 108. Second interconnection lines 109 may electrically connect between the cell diodes 101 and the quench resistors 108 through contact holes (see 170 of FIG. 11) of the first and second interlayer dielectrics 150 and 160.

When a bias voltage is applied to the first interconnection lines 106 and the bottom electrode 180, a depletion region (not shown) may be induced in the first doped region 120 of the cell diodes 101 in the active region 102. The first doped region 120 may inhibit generation of a depletion region in the non-active region 104 at an edge of the active region 102.

Therefore, the photomultiplier according to the embodiment of the present invention may prevent premature edge breakdown of the cell diodes 101 by the first doped region 120 extending from the active region 102 to the non-active region 104.

A method of manufacturing a photomultiplier having the foregoing configuration according to an embodiment of the present invention is described as follows.

FIGS. 3 through 13 are cross-sectional views sequentially illustrating a method of manufacturing a photomultiplier of the present invention.

Figure 3:
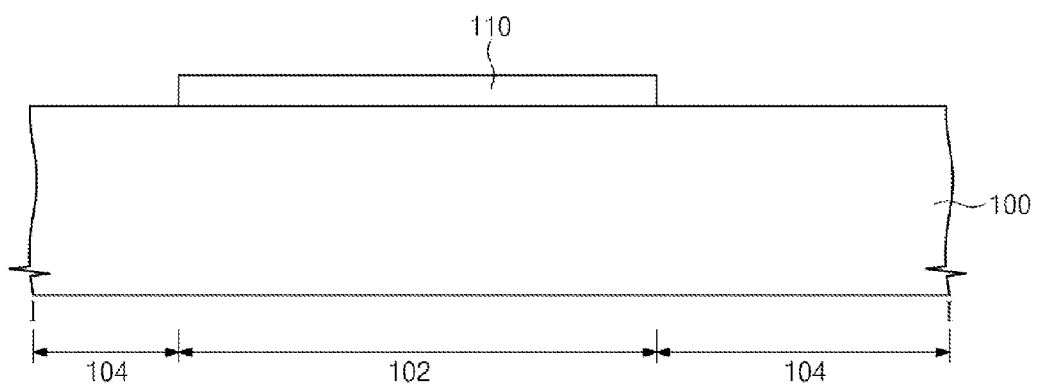
FIGS. 3 through 13 are cross-sectional views sequentially illustrating a method of manufacturing a photomultiplier of the present invention.

Referring to FIG. 3, a mask layer 110 is formed on an active region 102 of a substrate 100. The mask layer 110 may include a silicon nitride layer. The mask layer 110 may be patterned on the active region 102 by using a photo lithography process. The substrate 100 may be doped with a high concentration first conductive type impurity before the forming of the mask layer 110. For example, the substrate 100 may include a p-type substrate doped with high concentration boron (B).

Figure 4:
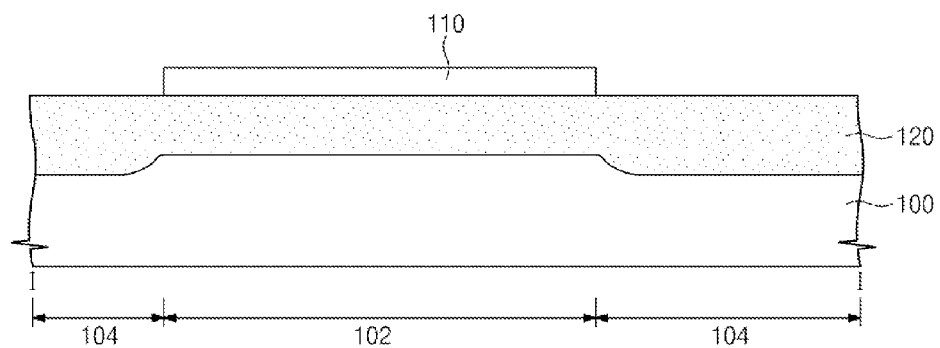

Referring to FIG. 4, a first doped region 120 is formed in the active region 102 and a non-active region 104. The first doped region 120 may have a first conductive type or second conductive type having a concentration lower than that of the substrate 100 by ion implantation of a second conductive type impurity. A net doping concentration of the first doped region 120 may be determined by amounts of the first conductive type impurity and the second conductive type impurity. When the amount of the first conductive type impurity is greater than that of the second conductive type impurity, the first doped region 120 may have a first conductive type. On the other hand, when the amount of the second conductive type impurity is greater than that of the first conductive type impurity, the first doped region 120 may have a second conductive type. For example, the first doped region 120 may be formed of a low concentration p-type or n-type. Therefore, the net doping concentration of the first doped region 120 may be determined by a counter ion implantation process of the second conductive type impurity. The counter ion implantation process may include a multiple ion implantation method having different energies.

The first doped region 120 may be formed in the substrate 100 deeper in the non-active region 104 than in the active region 102. The mask layer 110 may act as a screen adjusting the amount and depth of the second conductive type impurity in the active region 102 during ion implantation. The first doped region 120 in the active region 102 may be formed in a depth being increased by inversely proportional to a thickness of the mask layer 110. Therefore, the depth and doping concentration of the first doped region 120 may be adjusted by the mask layer 110.

Also, the first doped region 120 in the non-active region 104 may inhibit premature edge breakdown. The reason for this is that electric field strength of the first doped region 120 formed deeper in the non-active region 104 than the active region 102 is weakened.

Figure 5:
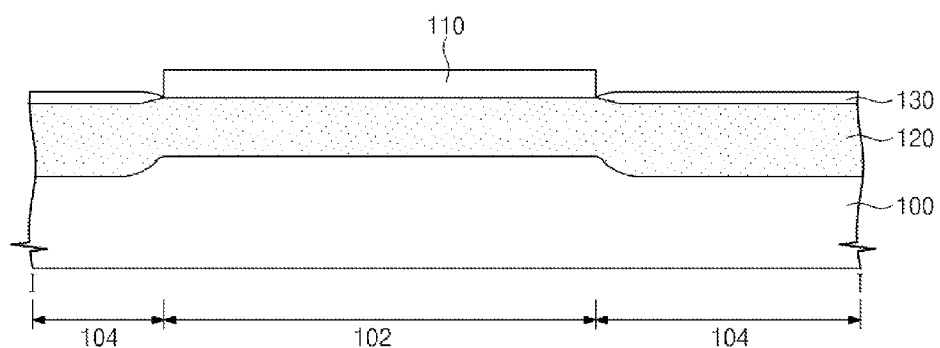

Referring to FIG. 5, a device isolation layer 130 is formed on the non-active region 104. The device isolation layer 130 may include a silicon oxide layer formed by using a local oxidation of silicon (LOCOS) method. The device isolation layer 130 may be formed on the non-active region 104 exposed from the mask layer 110.

Figure 6:
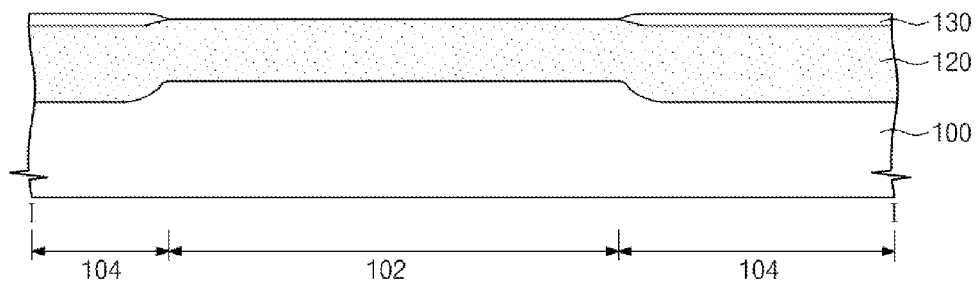

Referring to FIG. 6, the mask layer 110 on the active region 102 is removed. The mask layer 110 may be removed by an acid solution, such as a phosphoric acid, a hydrofluoric acid, or a bromic acid, or gas.

Figure 7:
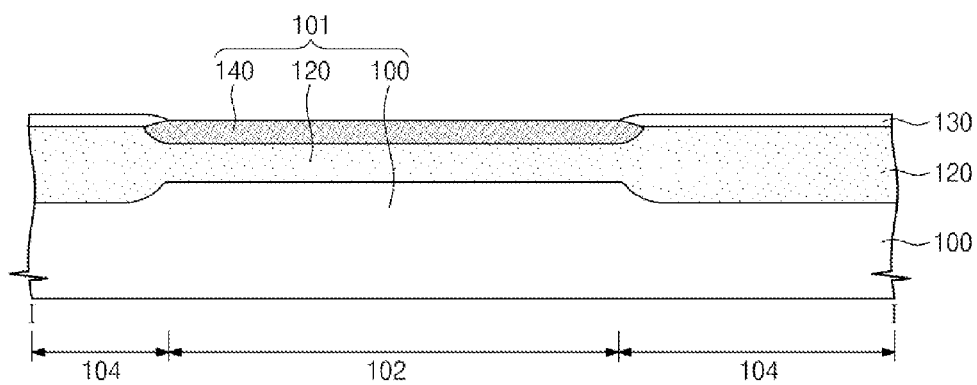

Referring to FIGS. 1 and 7, a second doped region 140 is formed on an upper portion of the first doped region 120 in the active region 102. The device isolation layer 130 may be used as an ion implantation mask during the formation of the second doped region 140. The second doped region 140 may be formed by a self-aligned ion implantation process or self-aligned diffusion process of the device isolation layer 130.

The substrate 100 in the active region 102, the first doped region 120, and the second doped region 140 may constitute cell diodes 101. For example, the cell diodes 101 may have a $p^+/p/n^+$ or $p^+/n/n^+$ structure in the active region 102. The non-active region 104 and the device isolation layer 130 may be cell isolation parts electrically separating the cell diodes 101 by being depleted during an operation of a device. The cell diodes 101 may be formed by a single photolithography process.

Therefore, the method of manufacturing a photomultiplier according to the embodiment of the present invention may maximize productivity in comparison to a typical method.

Figure 8:
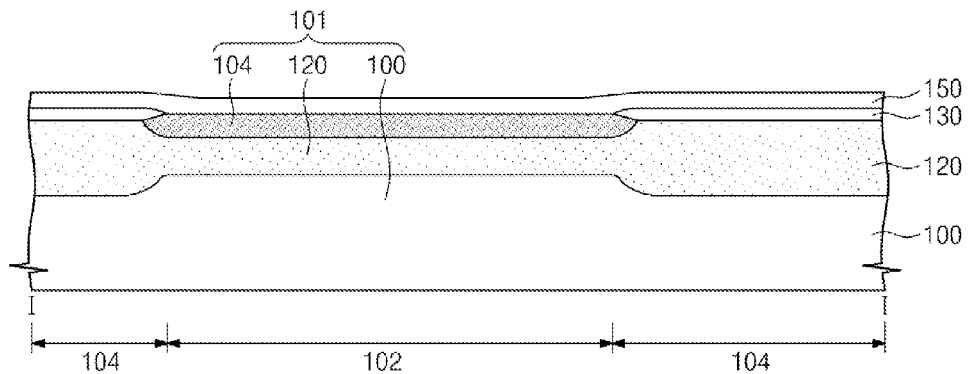

Referring to FIG. 8, a first interlayer dielectric 150 is formed on the substrate 100. The first interlayer dielectric 150 may include a silicon oxide layer formed by using a chemical vapor deposition method. The silicon oxide layer may be a transparent layer transmitting external light (not shown). Although not shown in the drawings, the first interlayer dielectric 150 may be removed on the active region 102 by a wet etching method or dry etching method.

Figure 9:
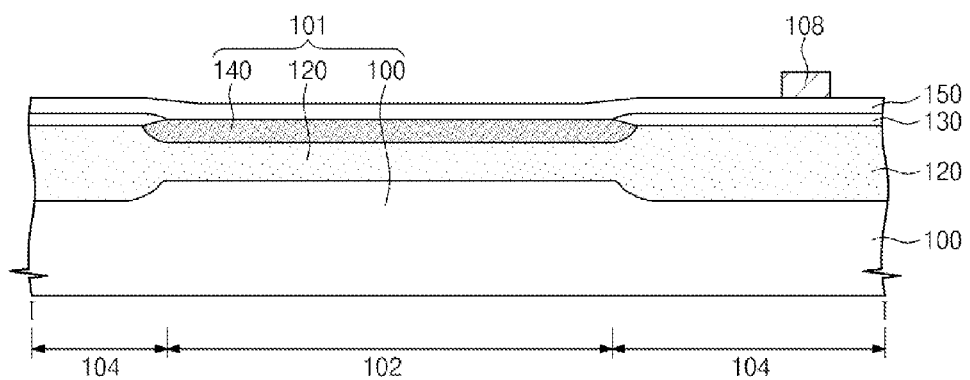

Referring to FIG. 9, a quench resistor 108 is formed on a portion of the first interlayer dielectric 150 in the non-active region 104. The quench resistor 108 may include a dielectric such as polysilicon or a metal oxide layer.

Figure 10:
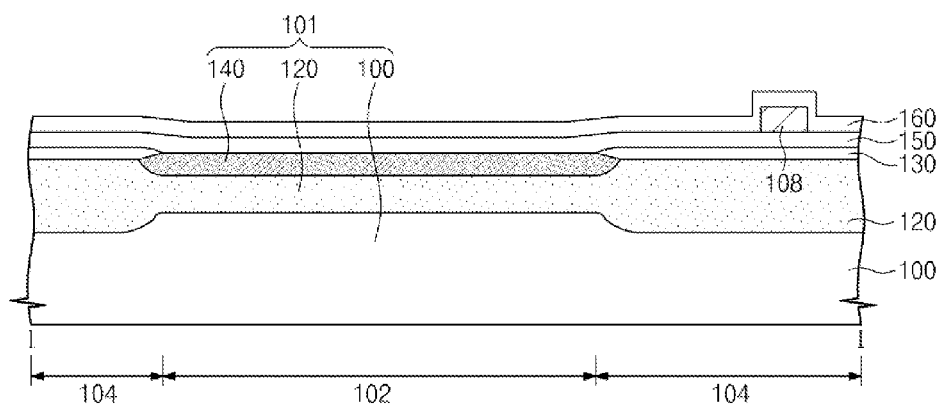

Referring to FIG. 10, a second interlayer dielectric 160 is formed on the entire substrate 100. The second interlayer dielectric 160 may include a silicon oxide layer formed by using a chemical vapor deposition method. The second interlayer dielectric 160 may be a protective layer.

Figure 11:
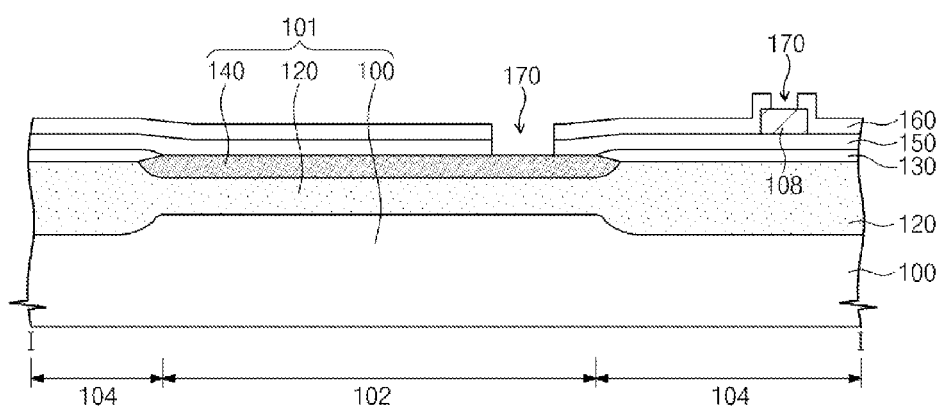

Referring to FIG. 11, portions of the first and second interlayer dielectrics 150 and 160 in the active region 102 and a portion of the second interlayer dielectric 160 on the quench resistor 108 are removed to form contact holes 170. The contact holes 170 may respectively expose portions of the second doped region 140 and the quench resistor 108.

Figure 12:
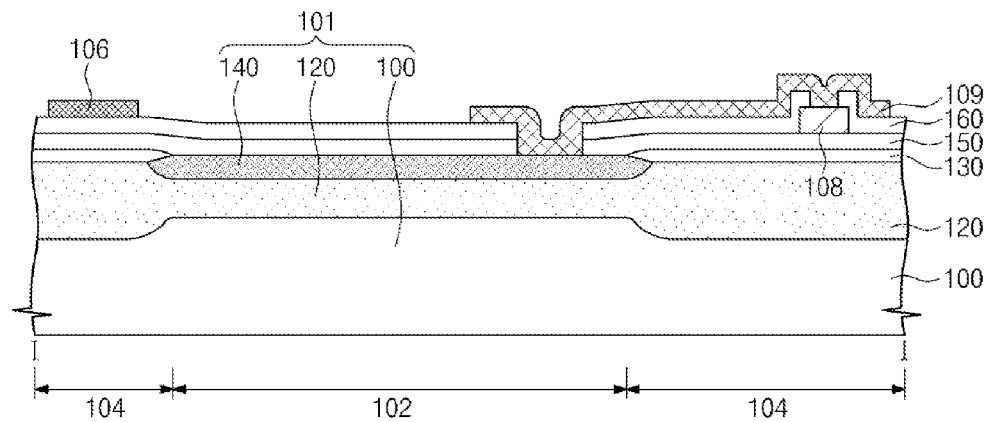

Referring to FIG. 12, a first interconnection line 106 and a second interconnection line 109 are formed. The first interconnection line 106 may be formed on the second interlayer dielectric of the non-active region 104. The second interconnection line 109 may electrically connect between the second doped region 140 and the quench resistor 108 through contact holes 170.

Figure 13:
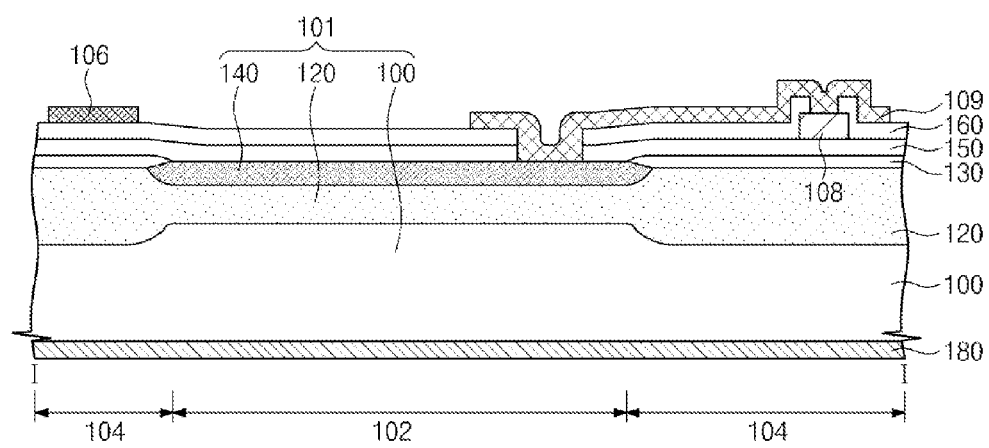

Referring to FIGS. 1 and 13, a bottom electrode 180 is formed on a bottom of the substrate 100. The bottom electrode 180 may include a conductive metal having high conductivity and reflection efficiency such as aluminum or tungsten.

Eventually, the method of manufacturing a photomultiplier according to the embodiment of the present invention may maximize productivity because the cell diodes 101 may be formed by a single photolithography process.

According to an embodied configuration of the present invention, a mask layer is formed on an active region of a substrate doped with a first conductive type by using a photolithography process. Next, a second conductive type impurity is ion implanted into the substrate to form a first doped region in the active region under the mask layer and a non-active region. A device isolation layer is formed on the non-active region exposed from the mask layer and the mask layer is removed. A second doped region shallower than the first doped region is formed in the active region by using an ion implantation process self-aligned from the device isolation layer. A cell diode including a lower portion of the substrate in the active region, the first doped region, and the second doped region may be formed by a single lithography process. Therefore, a method of manufacturing a photomultiplier of the present invention may maximize productivity.

Also, the first doped region may inhibit generation of a depletion region in the non-active region. Therefore, the photomultiplier of the present invention may prevent premature edge breakdown of the cell diodes by the first doped region extending from the active region to the non-active region.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, the preferred embodiments should be considered in descriptive sense only and not for purposes of limitation.

What is claimed is:

1. A method of manufacturing a photomultiplier, the method comprising:
    forming a mask layer on an active region of a substrate doped with a first conductive type;
    ion implanting a second conductive type impurity opposite to the first conductive type into the substrate to form a first doped region in the active region under the mask layer and an non-active region exposed from the mask layer;
    forming a device isolation layer on the non-active region;
    removing the mask layer; and
    ion implanting the second conductive type impurity having a concentration higher than that of the first doped region into an upper portion of the first doped region in the active region to form a second doped region shallower than the first doped region.

2. The method of claim 1, wherein the first doped region is formed by a counter ion implantation process.

3. The method of claim 2, wherein the counter ion implantation process comprises a multiple ion implantation method.

4. The method of claim 1, wherein the second doped region is formed by a self-aligned ion implantation process or self-aligned diffusion process of the device isolation layer.

5. The method of claim 1, wherein the device isolation layer comprises a silicon oxide layer formed by a LOCOS (local oxidation of silicon) method.

6. The method of claim 1, wherein the mask layer comprises a silicon nitride layer.

7. The method of claim 6, wherein the silicon nitride layer is removed by a phosphoric acid, a hydrofluoric acid, or a bromic acid.

8. The method of claim 1, further comprising:

forming a first interlayer dielectric on the second doped region and the device isolation layer;

forming a quench resistor on the first interlayer dielectric in the non-active region;

forming a second interlayer dielectric on the first interlayer dielectric and the quench resistor;

removing a portion of the second interlayer dielectric on the quench resistor and each portion of the first and second interlayer dielectrics on the second doped region to form contact holes;

forming a first interconnection line on the second interlayer dielectric in the non-active region and a second interconnection line connecting the second doped region and the quench resistors through the contact holes; and forming a bottom electrode on a bottom of the substrate.

\* \* \* \* \*